United States Patent [19]

Shimizu et al.

[11] Patent Number: 4,524,098

[45] Date of Patent: Jun. 18, 1985

[54] BOARD FOR ADDITIVE CIRCUITS

[75] Inventors: Tadao Shimizu, Tachikawashi; Noriyuki Shimizu; Shoji Harada, both of Tokyo, all of Japan

[73] Assignee: Nikkan Industries Co., Ltd., Tokyo, Japan

[21] Appl. No.: 493,269

[22] Filed: May 10, 1983

[30] Foreign Application Priority Data

Oct. 9, 1982 [JP] Japan .................. 57-177994

[51] Int. Cl.$^3$ .................. B32B 15/14; C04B 39/08; H05K 1/02
[52] U.S. Cl. .................. 428/156; 428/901; 428/702; 501/32
[58] Field of Search .................. 428/901, 156, 702; 501/32

[56] References Cited

U.S. PATENT DOCUMENTS 3,949,147  4/1976  Hawthorne .................. 428/702 X
4,335,216  6/1982  Hodgkins et al. .................. 501/32

FOREIGN PATENT DOCUMENTS 149708  11/1979  Japan .................. 428/901

Primary Examiner—George F. Lesmes
Assistant Examiner—Nancy A. B. Swisher
Attorney, Agent, or Firm—Cushman, Darby & Cushman

[57] ABSTRACT

There is provided a board for additive circuits which is formed with plural convexo-concave irregularities on the surface of an inorganic composite plate wherein a needle-like or fiber-like inorganic material is present as a mixture with an isotropic solid vitreous inorganic material while maintaining its needle-like or fiber-like form.

9 Claims, No Drawings

BOARD FOR ADDITIVE CIRCUITS

CROSS REFERENCE TO RELATED APPLICATIONS

To prepare the board of the present invention there is employed the inorganic composite claimed in companion Shimizu et al. application Ser. No. 493,271, filed May 10, 1983, entitled "INORGANIC COMPOSITE AND THE PREPARATION THEREOF", based on Japanese priority application No. 57-78028 of May 10, 1982 and No. 57-78029 of May 10, 1982. Attention is also called to companion Shimizu et al. application Ser. No. 493,270, filed May 10, 1983 entitled "METAL CLAD SUBSTRATE FOR PRINTED CIRCUIT BOARDS AND THE METHOD FOR MANUFACTURING THE SAME", based on Japanese priority applications No. 57-177993 of Oct. 9, 1982 and No. 57-78030 of May 10, 1982. The entire disclosures of the companion applications are hereby incorporated by reference and relied upon.

BACKGROUND OF THE INVENTION (1) Field of the Invention

The present invention relates to a board for an additive circuit which is suitable for electric circuits used in electronic apparatuses.

(2) Description of the Prior Art

Additive circuits of this type are formed by precipitating a conductive pattern on a substrate board by using electroless disposition alone or in combination with an electro-plating method which does not require cladding of copper in advance on the surface of an insulating material. The surface of a board for additive circuits is required to have plural minute convexo-concave irregularities in order to improve bonding with plated layers.

In prior art, organic composite materials such as epoxy/glass laminated plates are often used as the material for such boards because of advantages in producing them and their mechanical workability. However, the laminated plate must be treated with chromic acid to roughen the surface in order to improve bonding in electroless deposition, thereby making the process complicated and pushing up the manufacturing cost due to the expensive treatment needed for waste disposal. There have been proposed various methods to use resin on the surface of such laminated plates which are expected to promote roughening for a higher bonding in plating. The resin provided on the surface of the laminated plate, however, makes the laminated plate susceptible to humidity.

The above organic composite materials, especially the organic component such as the adhesive therein are inferior in heat resistance. As they therefore do not have the desired insulation resistance at high temperatures nor good dielectric characteristics and are susceptible to humidity, they are detrimental in that they cannot be used at higher temperatures for a long time.

As the general trend in electronic apparatuses aims at minimizing the size and decreasing the thickness of a device, the packaging density of parts on a substrate for a printed circuit board is increasing while such substrate is required to have excellent radiation and size stability characteristics.

The copending application referred to above based on Japanese priority applications No. Sho 57-78028 and 57-78029 for "An Inorganic Composite and the Preparation Thereof" which is characterized in that a needle-like or fiber-like inorganic material is present as a mixture in an isotropic solid vitreous inorganic material while maintaining its needle-like or fiber-like form and which is prepared by a method comprising the steps of kneading a mixture containing a vitreous inorganic material and a needle-like or fiber-like inorganic material, molding the mixture into a predetermined shape, calcining the molded material at a temperature above the softening point of the vitreous inorganic material and below the melting point of the needle-like or fiber-like inorganic material is designed to obviate the defects of the prior art substrates.

As the above inorganic composite is molded into a flat plate by extrusion or compression molding, at least one of the molded surfaces tends to form a smooth surface. If such plate is used as the board for additive circuits without further treatment, the adhesion with the plated layer becomes unstable.

BRIEF SUMMARY OF THE INVENTION (1) Objections of the Invention

The present invention aims at obviating the above-mentioned defects and at providing a board for additive circuits which has a good heat resistance, superior mechanical workability, a smaller thermal expansion, high heat radiation and heat shielding characteristics and which is inexpensive in manufacturing cost and does not cause pollution.

(2) Features of the Invention

The present invention is characterized in that plural minute convexo-concave irregularities are formed on the surface of an inorganic composite plate wherein a needle-like or fiber-like inorganic material is present as a mixture with an isotropic solid vitreous inorganic material.

The aforementioned minute irregularities present in a large number on the surface is preferably 3 to 50 μm in R max.

The above-mentioned needle-like inorganic material is preferably calcium metasilicate.

The above-mentioned fiber-like inorganic material is preferably fibers of the potassium titanate or magnesium silicate type.

The term "R max" used herein defines the value of a core expressed in terms of microns which is obtained by extracting a core of a predetermined length from the sectional curve of an additive circuit board, using the length as the reference length, and measuring the part interposed between two lines parallel to the average line (or the line which minimizes the sum of squares of the deviations from the measured surface to the sectional curve) in the direction of vertical magnification.

DETAILED DESCRIPTION

The present invention will now be described in more detail. The needle-like inorganic material is a natural inorganic substance represented by calcium metasilicate. Calcium metasilicate is a substance containing the principal component as expressed by the chemical formula $CaSiO_3$: the ratio of its length to the diameter is greater than 10:1. It is an inorganic substance in light white color and in needle-like crystalline structure. It has an excellent heat resistance with the melting point at about 1,500° C. and is obtainable at a low price equal to or less than that of glass powder. It is a natural substance. Wollastonite (manufactured by NYCO) is one example of natural needle-like calcium metasilicate.

The fiber-like inorganic material is an inorganic material represented by fibers of potassium titanate or of magnesium silicate. The fibers of potassium titanate are expressed by the chemical formula of $K_2O \cdot nTiO_2$ or $K_2O \cdot nTiO_2 \cdot mH_2O$ and are fibrous in shape having a diameter smaller than the diameter of the needle-like inorganic material of which the ratio between the length and the diameter is greater than 10:1. It should be noted that the numbers represented above by the symbols n and m does not need to be an integer.

A method for mass-producing such potassium titanate fibers at a lower cost has recently been developed and fibers with the ratio between the length and the diameter being greater than 1,000:1 can be easily obtained. Such fibers of potassium titanate can include the fibers of hydrated titanium oxide ($TiO_2 \cdot mH_2O$) which are obtained by acid-treating potassium titanate fibers and the fibers of titanium dioxide ($TiO_2$) as a derivative of potassium titanate which is obtained by calcining said hydrated titanium oxide fibers as well as hydrated potassium titanate fibers are removed at the calcining stage and the resultant inorganic substances become stabilized.

As derivatives of potassium titanate fibers other than those mentioned above, there are fibrous barium titanate and strontium titanate which are synthesized by reacting potassium titanate fibers as the starting material with a barium or strontium compound.

The potassium titanate fibers are particularly superior in heat resistance and mechanical strength, have a melting point of about 1,300° C. and a tensile strength greater than glass fibers by about three-fold.

Fibers of magnesium silicate are generally known as asbestos. Asbestos is a general term for natural minerals of silicates in needle-like or fiber-like form. Asbestos of particular significance in the present invention is chrysotile ($H_4Mg_3Si_2O_9$) magnesium silicate. The ratio of length to diameter in chrysotile is greater than 10:1, and some of the lengthy ones extend as long as 5 cm. The chrysotile is an inexpensive mineral of chalky white in color which starts losing its constitution water at about 500° C. and retains its fibrous structure even at 800° C.

The needle-like or fiber-like inorganic materials are not limited to fibers of calcium metasilicate or potassium titanate and fibers of magnesium silicate but include such heat resistant inorganic materials as alumina ($Al_2O_3$), silicon carbide (SiC), silicon nitride ($Si_3N_4$), boron nitride (BN), etc. The crystal form of needle-like or fiber-like material also includes other similar crystal forms such as in fine annulation or strip. The needle-like inorganic materials are not limited to those occurring naturally but include man-made inorganic materials as well.

Both the needle-like and the fiber-like inorganic materials mentioned above are superior in heat resistance and strength. However, the temperatures at which each can be molded singly is high and if they are respectively calcined at this high temperature, they lose the needle-like or fiber-like form and become inferior in mechanical workability like other sintered inorganic materials.

The vitreous inorganic materials may include any glass material in general; Table 1 shows examples of typical vitreous inorganic materials. The properties of those vitreous materials are shown in Table 2.

The type of vitreous material is selected depending on the use of additive circuit board.

TABLE 1

| | Type of Glass | | | | | Unit: wt % |
|---|---|---|---|---|---|---|
| Composition | Glass A | Glass E | Glass C | Glass S | Glass D | Quarz Glass |
| $SiO_2$ | 71.6 | 54 | 62.5 | 64.3 | 73.4 | 99.99 |
| $Al_2O_3$ | 0.48 | 14 | 4 | 24.8 | 1.2 | <0.01 |
| CaO | 10.7 | 20 | 17.5 | <0.01 | 1.0 | — |
| MgO | 2.02 | 3 | 10.3 | 0.2 | | — |
| $K_2O$ | 15.0 | 0.5 | 10 | 0.27 | 3.0 | —. |
| $Fe_2O_3$ | 0.14 | — | — | 0.2 | — | — |
| $B_2O_3$ | — | 10.5 | 4.5 | <0.01 | 21.8 | — |

TABLE 2

| Properties | | Type of Glass | | | | | |
|---|---|---|---|---|---|---|---|
| | | Glass A | Glass E | Glass C | Glass S | Glass D | Quarz Glass |
| Mechanical Properties | | | | | | | |
| Specific Gravity | — | 2.50 | 2.54 | 2.49 | 2.49 | 2.16 | 2.20 |
| Tensile Strength | kg/mm² | 280 | 350 | 340 | 470 | 245 | 60 |
| Electrical Properties | | | | | | | |
| Dielectric Constant | (1 MHz) | 6.5 | 5.8 | 6.24 | 4.53 | 3.56 | 3.7 |
| Dissipation Factor | (1 MHz) | 0.007 | 0.001 | 0.005 | 0.002 | 0.0005 | 0.0001 |
| Volume Resistivity | Ω cm | $10^{10}$ | $10^{14}$ | $10^{12}$ | $10^{16}$ | $10^{12}$ | $10^{18}$ |
| Thermal Properties | | | | | | | |
| Coefficient of Linear Expansion | × $10^{-6}$ | 8.5 | 5.0 | 7.4 | 5.6 | 3.1 | 0.54 |
| Softening Point | °C. | 710 | 845 | 750 | 970 | 770 | 1670 |
| Specific Heat | cal/g °C. | 0.20 | 0.197 | 0.212 | 0.176 | 0.175 | 0.230 |
| Optical Properties | | | | | | | |
| Index of Refraction | — | 1.52 | 1.547 | 1.541 | 1.523 | 1.47 | 1.459 |

The preparation of the additive circuit boards according to the present invention comprises the steps of kneading a mixture containing a vitreous inorganic material and a needle-like or fiber-like inorganic material which does not melt at the softening point of the vitreous inorganic material, and if necessary, adding a third additive for kneading with said mixture.

The first method of preparation comprises molding the above mixture with a mold which has been formed with irregularities on the surface thereof in advance by blast finishing into a flat plate-like shape, and thus providing the molded material with the irregularities of the mold. The molded material is calcined at a temperature above the softening temperature of said vitreous inorganic material and below the melting point of said needle-like or fiber-like inorganic material to obtain a board for additive circuits. The blast finishing used herein defines a finishing method of blasting fine sands onto a metal surface to grind the same and to form irregularities thereon, and the roughness of the surface is measured according to JIS B 0601.

The second preparation method comprises the steps of roughening by matte finishing the surface of a mold release film which is used for removing the molded material from a mold so that the surface of the molded material can be shaped, profiling the roughened surface of the film. The molded material is then calcined at a temperature above the softening point of said vitreous inorganic material and below the melting point of said needle-like or fiber-like inorganic material to obtain an additive circuit board.

The film used herein may be an inexpensive thermoplastic film such as polypropylene or polyester (e.g. polyethylene terephthalate) and the surface thereof is preferably roughened to the depth of 3 to 7 $\mu$m. Instead of film, a metal foil such as aluminium foil which is blast finished on the surface may be used. The matte finish used herein defines a finishing method of blasting the film surface to give fine irregularities for delustering: the roughness is measured according to JIS B 0601.

In the third method of preparation, the said mixture is molded into a flat plate. A substance which disperses (is eliminated) at the calcining temperature from the surface layer of the molded material is included therein at the primary molding stage and the post molding stage and then is calcined at a temperature above the softening point of said vitreous inorganic material and below said needle-like or fiber-like inorganic material to obtain an additive circuit board.

The above-mentioned substance which is to be dispersed may be camphor, paraffin, mineral oil, starch, styrene, methyl alcohol, thermosetting resin, and thermoplastic resin. The larger the mixing ratio of this dispersing material is, the more desirable the roughening of the surface becomes. It should be noted that the roughening must be limited to the surface layer alone because if roughening extends into the inside of the inorganic composite, this will deteriorate resistance against humidity of the additive circuit board. According to this method, molded material may be swollen or dissolved with a solvent, water or other chemical substance in advance and then calcined to obtain a good result. A hydroxide or a hydrate of an inorganic substance from which water molecules are dispersed (eliminated) at the calcining temperature may be added to the mixture to prepare the surface layer.

The fourth method of preparation comprises the steps of molding said mixture into a flat plate, calcining the same at a temperature above the softening point of said vitreous inorganic material and below the melting point of said needle-like or fiber-like inorganic material, immersing the same into a solution which dissolves said vitreous inorganic material and roughening the surface of the calcined material to obtain an additive circuit board.

The roughness or the irregularities on the surface of the additive circuit board obtainable according to the above four methods is 3 to 50 $\mu$m in R max. It is evident that the bonding between the additive circuit board with plated layer is remarkably strengthened.

The vitreous inorganic material gives sintering/molding performance of the additive circuit board obtained according to said preparation methods. The needle-like or fiber-like inorganic material gives rise to the mechanical strength and the resultant additive circuit board will be endowed with excellent mechanical workability, enabling drilling or cutting working on the additive circuit board.

The ratio of mixing the needle-like or fiber-like inorganic material with the vitreous inorganic material is determined depending on the use of the final product or of the board for additive circuits. The ratio is preferably in the range of 2 to 50 wt. % of the needle-like or fiber-like inorganic material to 98 to 50 wt. % of the vitreous inorganic material. When the needle-like or fiber-like inorganic material is employed in an amount less than 2 wt. % and the vitreous inorganic material exceeding 98 wt. %, the resultant substrate would become inferior in mechanical strength and the mechanical workability. In case the needle-like of fiber-like inorganic material exceeds 50 wt. % and the vitreous inorganic material is less than 50 wt. %, the resultant substrate would become inferior in sintering/molding performance. Furthermore, if the needle-like or fiber-like inorganic material is increased to 80 wt. % with the vitreous material decreased to as little as 20 wt. %, sintering/molding would become possible by raising the calcining temperature but the mechanical workability would slightly deteriorate.

It is noted that kneading is continued until all the inorganic materials are uniformly mixed at normal temperature and pressure.

A third material may be added in such a range that said mechanical properties and workability in sintering/molding will not be hampered; more preferably, it is added in an amount less than 20 wt. % in said mixing ratio, e.g. 10 to 20 wt. %. This addition preferably includes materials which improve the moldability or sintering performance of the mixture, or alter the dielectric characteristics of the board for additive circuits. If a material which improves the sintering performance is added to the mixture during kneading, it is possible to lower the sintering temperature as well as to obtain an additive circuit board having high density.

For altering the dielectric characteristics of the additive circuit boards, a third inorganic material such as titanium dioxide powder which increase the dielectric constant or boric acid which decreases the dielectric constant is employed. It is also possible to add a vitreous inorganic material which has desired dielectric characteristics during kneading. In case an electric insulation in the ordinary range is to be obtained, glass E having the dielectric constant of 5.8 as shown in Table 2 is selected as the vitreous inorganic material. In case a lower dielectric constant is required, glass D having the dielectric constant of 3.56 is selected. For higher dielectric constant, glasses having higher content of PbO, BaO, etc. are selected. Thus, an additive circuit board having desired dielectric constant can be manufactured.

The kneaded mixture is then molded into a first plate which is optimum for use as a substrate for additive circuit boards. Various molding methods such as compression, extrusion, injection and the like can be employed. It is especially noted that by orienting the longer diameter of the needle-like or fiber-like inorganic material along the horizontal direction of the substrate for additive circuit boards at the time of compression or extrusion molding, the shrinkage of the substrate in size in the horizontal direction can be reduced. At the same time, heat radiation in the horizontal direction and heat shielding in the thickness direction can be further improved.

The molded flat plate is calcined at a temperature above the softening point of the vitreous inorganic material and below the melting point of the needle-like or fiber-like inorganic material. The calcining conditions may be identical to those generally adopted in ceramics except for the calcining temperature. As compared to the calcining temperature adopted for other inorganic sintered materials, the calcining temperature is lower, and the energy needed for calcination can be saved and the calcination equipment can be simplified. As the mixture is calcined at a temperature below the melting point of the needle-like or fiber-like inorganic material, various properties of the needle-like or fiber-like inorganic material remain intact and the material can be present as a mixture with the isotropic solid vitreous inorganic material in the form of a flat plate. The calcined flat plate is then gradually cooled.

The present invention will be described in more detail by referring to the examples hereinbelow. It should be noted that these examples are given by way of explanation and they limit in no way the scope of the present invention.

The composition can comprise, consist essentially of, or consist of the stated materials and the process can comprise, consist essentially of, or consist of the recited steps with such materials.

Unless otherwise indicated all parts and percentages are by weight.

EXAMPLE 1

Potassium hexa titanate fibers ($K_2O.6TiO_2$) having an average diameter of 0.1 $\mu$m and an average length of 80 $\mu$m and the glass powder E shown in Table 2 are mixed in the ratio of 4:6 by weight % as the starting materials and kneaded by a kneader at normal temperature and at normal pressure until all the materials are uniformly mixed.

The kneaded mixture is then introduced into a hopper of an extruder and extruded from a die into a flat foil 1 mm in thickness to manufacture a flat plate 25×25 cm in size.

The flat plate thus obtained is interposed between stainless steel plates which are s 1 mm in thickness and is finished to have a roughness of 15 $\mu$m in depth, and then heat pressed at about 250° C. and at 500 kg/cm² for 5 minutes. The molded mixture is then calcined in a calcining furnace at 700° C. for 3 hours to produce a board for additive circuits which has a surface roughness (R max) of 7 to 23 $\mu$m, of 1 mm in thickness and 25×25 cm in size.

EXAMPLE 2

Potassium hexa titanate fibers ($K_2O.6TiO_2$) of 0.1 $\mu$m in average diameter and of 80 $\mu$m in average length, the E glass powder shown in Table 2 and boric acid ($H_3BO_3$) are mixed in the ratio of 3:7:1 by weight % as the starting materials, kneaded in the same manner as in Example 1 and molded by extrusion into a flat plate 2 mm in thickness and 25×25 cm in size.

Styrene in an amount of 20 weight % is added to the above mixture and kneaded to obtain a mixture. The mixture is then coated uniformly for a thickness of 20 $\mu$m on both surfaces of said flat plate by using an applicator.

The plate which has been coated with the mixture is dried at 160° C. for 24 hours to eliminate the styrene. Polypropylene film 40 $\mu$m in thickness which has been matte treated is placed on both surfaces of the plate and heat pressed for molding at about 160° C. at 40 kg/cm² for 5 minutes. The plate is gradually cooled, then taken out, removed from the film, calcined in a calcining furnace at 700° C. for 3 hours to obtain an additive circuit board 2 mm in thickness and 25×25 cm in size which has the surface roughness (R max) of 3 to 15 $\mu$m.

EXAMPLE 3

Potassium hexa titanate fibers ($K_2O.6TiO_2$) 0.1 $\mu$m in average diameter and 80 $\mu$m in average length, calcium metasilicate (Wollastonite) 8.2 $\mu$m average diameter and 110 $\mu$m average length, and the A glass powder shown in Table 2 are mixed in the ratio of 2:2:6 by weight, methyl alcohol added in an amount of 25 weight % of the mixture. The mixture is kneaded at normal temperature and pressure with three rolls in a manner to retain viscous from until all the materials are uniformly mixed.

The kneaded mixture is pressed with two rolls into a molded material in the form of a sheet 1.0 mm thick.

The sheet-like molded plate 25×25 cm in size is then dried at 200° C. for 16 hours to remove methyl alcohol and heat pressed into a mold at about 250° C. and at 500 kg/cm² for 5 minutes in order to improve density.

Methyl alcohol in an amount of 30 weight % is added to the above mixture of four materials to form a liquid of higher viscosity. The liquid is coated on an aluminium foil 30 $\mu$m in thickness which is heated at 50° C.

The coated surface of an aluminium foil is placed on both surfaces of said sheet-like molded plate with its coated surface containing the surfaces of the plates, pressed to transfer the form, thereby forming a thin film 30 $\mu$m thick on both surfaces of the plate. The molded plate is passed through a tunnel furnace under an oxidizing atmosphere with the gradient of temperature from 200° to 700° C. at the rate of 0.3 m/minute to calcine it for 1 hour. The resultant circuit board for additive circuits has a surface roughness (R max) of 5 to 18 $\mu$m, a thickness of 1.0 mm and size of 25×25 cm.

EXAMPLE 4

Calcium metasilicate (Wollastonite) 6.0 $\mu$m average diameter and 60 $\mu$m average length and the E glass shown in Table 2 are mixed at the ratio of 2:4 by weight % and kneaded in the manner similar to that of Example 1.

The kneaded mixture is divided into two parts. Styrene is added in an amount of 70 weight % to one part and it is agitated to obtain a suspension. The suspension is coated by using an applicator on a fluorinated polymer film having a thickness of 40 $\mu$m which has been matte treated to obtain a thickness of 40 $\mu$m. The film is dried and heated at 200° C. for 10 hours to eliminate styrene.

The other part of the mixture is provided with the fluorinated polymer (e.g. Teflon) film placed in a mold and heat pressed at about 180° C. at 200 kg/cm² for 15 minutes. After gradual cooling the molded material is removed from the mold, the film removed and the molded material calcined in a calcining furnace at 700° C. for 3 hours. The resultant board for additive circuits has a surface roughness (R max) of 3 to 16 $\mu$m, a thickness of 2.1 mm and side of 25×25 cm.

EXAMPLE 5

Potassium hexa titanate fibers ($K_2O.6TiO_2$) 0.5 μm average diameter and 50 μm average length and the D glass powder shown in Table 2 are mixed in a ratio of 4:6 by weight as the starting materials and kneaded in a manner similar to that of Example 1.

The kneaded mixture is divided into two parts. One part is placed in a mold and heat pressed at about 150° C. and at 200 kg/cm² for 15 minutes. After gradual cooling, the molded material is taken out to obtain a flat plate 2.0 mm thick and 25×25 cm in size.

To the other part of the mixture there is added 20 weight % of aluminium hydroxide ($Al(OH)_3$) and 50 weight % of methyl alcohol. The mixture is agitated to form a liquid. The liquid is coated by using an applicator on both surfaces of said plate to form a thin film layer of 50 μm in thickness.

The plate is dried and heated at 200° C. for 10 hours to oxidize a part of aluminium hydroxide as well as to eliminate the methyl alcohol. The resultant board for additive circuits has a surface roughness (R man) of 15 to 20 μm, a thickness of 2.1 mm and size of 25×25 cm.

EXAMPLE 6

Potassium hexa titanate ($K_2O.6TiO_2$) fibers 0.1 μm average diameter and 80 μm average length and the E glass powder shown in Table 2 are mixed in the ratio of 4:6 by weight, and kneaded in a manner similar to Example 1 for extrusion molding. The resultant plate has a thickness of 2 mm and size of 25×25 cm.

The plate is calcined in an electric furnace at 800° C. for 2 hours to obtain an inorganic composite plate. The surface layer of the inorganic composite plate is sprayed at normal temperature with a solution of 10% of hydrofluoric acid containing chromium oxide of 3 μm particle diameter in an amount of 10 weight % to partially melt the vitreous component of the surface layer. The resultant board for additive circuits has a surface roughness (R max) of 5 to 20 μm. The boards for additive circuits thus obtained in examples 1 through 6 are electroless-deposited with copper and electroplated with copper sulfate to obtain plated layers 30 μm thick. The plated layers are evaluated for peeling strength.

Table 3 indicates the result of the evaluation. The test results show that all plates obtained are usable in practice as boards for additive circuits.

TABLE 3

| | Copper Plate Peeling Strength Unit: kg/cm |
|---|---|
| Example 1 | 1.7 |
| 2 | 1.2 |
| 3 | 1.4 |
| 4 | 1.6 |
| 5 | 1.6 |
| 6 | 1.7 |

What is claimed is:

1. A press-molded board suitable for use in additive circuits which board is formed with minute convexo-concave irregularities in a large number on the surface of an inorganic composite plate wherein there is present (1) potassium titanate as a fiber-like inorganic substance alone or together with a needle-like inorganic substance in admixture with (2) an isotropic solid vitreous inorganic substance having a softening point below the melting point of the needle-like or fiber-like inorganic material, while maintaining the needle-like or fiber-like form of (1), wherein the total weight of (1) and (2) contains 2 to 50% of the needle-like or fiber-like inorganic material (1) and 98 to 50% of the vitreous inorganic material (2), said irregularities on the surface are of 3 to 50 μm in R max.

2. A board according to claim 1 containing 0 to 20% of the total weight of the composite of a third inorganic material.

3. A board according to claim 2 consisting of (1) and (2).

4. A board according to claim 2 including a third inorganic material in amount effective to alter the dielectric characteristics of the inorganic composite.

5. A board according to claim 4 wherein the third inorganic material is titanium dioxide powder or boric acid.

6. A board according to claim 1 including both a needle-like inorganic material and the potassium titanate fiber-like inorganic material.

7. A board according to claim 1 including a needle-like inorganic material.

8. A board according to claim 7 wherein the needle-like material is calcium metasilicate.

9. A board according to claim 1 including needle-like calcium metasilicate.

* * * * *